(12) United States Patent
Ladebeck et al.

(10) Patent No.: US 6,703,836 B2
(45) Date of Patent: Mar. 9, 2004

(54) MAGNETIC RESONANCE APPARATUS ISOLATION SYSTEM

(75) Inventors: Ralf Ladebeck, Erlangen (DE); Guenter Schnur, Hemhofen (DE)

(73) Assignee: Siemens Aktiengesellschaft, Munich (DE)

( * ) Notice: Subject to any disclaimer, the term of this patent is extended or adjusted under 35 U.S.C. 154(b) by 104 days.

(21) Appl. No.: 09/964,567

(22) Filed: Sep. 28, 2001

(65) Prior Publication Data

US 2002/0041186 A1 Apr. 11, 2002

(30) Foreign Application Priority Data

Sep. 29, 2000 (DE) .......................... 100 48 340

(51) Int. Cl.[7] ................................. G01V 3/00
(52) U.S. Cl. ........................ 324/318; 324/309
(58) Field of Search ................. 324/318, 309, 324/322; 348/638; 318/649; 248/550; 62/51.1; 52/720.1

(56) References Cited

U.S. PATENT DOCUMENTS

| 5,181,385 | A | * | 1/1993 | Saho et al. ................. 62/51.1 |
| 5,734,246 | A | * | 3/1998 | Falangas ..................... 318/649 |
| 5,924,261 | A | * | 7/1999 | Fricke ......................... 52/720.1 |
| 6,089,525 | A | * | 7/2000 | Williams ..................... 248/550 |
| 6,196,514 | B1 | * | 3/2001 | Kenholz ...................... 248/550 |
| 6,213,442 | B1 | * | 4/2001 | Ivers et al. ................. 248/550 |
| 6,375,147 | B1 | * | 4/2002 | Radziun et al. ............. 348/638 |

FOREIGN PATENT DOCUMENTS

| DE | 44 32 747 C2 | 3/1997 |
| EP | 1 085 336 A2 | 3/2001 |

\* cited by examiner

*Primary Examiner*—Diego Gutierrez
*Assistant Examiner*—Brij B. Shrivastav
(74) *Attorney, Agent, or Firm*—Young & Thompson

(57) ABSTRACT

A nuclear magnetic resonance tomograph or an imaging magnetic resonance apparatus (1) has a magnet (3) which is isolated in terms of vibration from a surrounding structure, in particular a building floor (15), by an isolation system (17). The isolation system (17) has an actively controlled isolation module (23) which is preferably designed to damp non-acoustic vibrations, in particular vibrations with a frequency of less than 50 Hz. According to a preferred embodiment, moreover, a passive isolation module (21) with a vibration-damping material (D) is present. A particularly high degree of isolation of the magnet (3) from the surrounding structure can be achieved with the aid of the isolation system (17).

6 Claims, 2 Drawing Sheets

MAGNETIC RESONANCE APPARATUS ISOLATION SYSTEM

BACKGROUND OF THE INVENTION

The invention relates to an imaging magnetic resonance apparatus with a magnet.

DESCRIPTION OF RELATED ART

Imaging magnetic resonance apparatuses or nuclear magnetic resonance tomographs have a magnet for generating a constant magnetic field, for example an electromagnet coil. Electromagnetic waves necessary for exciting the atomic nuclei are generated by radio-frequency coils which emit pulsed waves. In the pauses, they receive a nuclear magnetic resonance signal emitted by the excited atomic nuclei. In order to be able to represent multidimensional body sections pictorially, it is necessary to determine the site of the origin of the emitted wave. For this purpose, in addition to the constant magnetic field a further magnetic field, which has a different magnitude at each site, is generated. This further magnetic field is generated by what is termed a gradient coil. The received nuclear magnetic resonance signals are fed to a computer in which the data are combined to form an image.

The requirements placed on the temporal stability of the spatially constant magnetic field are very high.

SUMMARY OF THE INVENTION

It is the object of the invention to specify an imaging magnetic resonance apparatus with a magnet in the case of which the constant magnetic field generated by the magnet is particularly stable over time.

This object is achieved according to the invention by virtue of the fact that the magnetic resonance apparatus has an isolation system for vibrational isolation of the magnet from a surrounding structure, in particular from a building floor, the isolation system having an actively controlled isolation module.

The invention proceeds in this case from the following consideration:

At a specific resonant frequency, the magnet can be excited to a natural vibration. The resonant frequency is usually below 100 Hz, for example at 16 Hz for a C-shaped permanent magnet with a structure in the shape of a tuning fork. A disturbing vibration, for example a building vibration, of just 65 to 75 dB below the gravitational acceleration (g) would suffice to excite this resonance so strongly that the investigations would be impaired. It is primarily the vertical component of the vibration that is disturbing in this case.

The invention further proceeds from the consideration that passive vibrational isolation alone is not sufficient for an imaging magnetic resonance apparatus. The reason for this is that passive vibrational isolation can be carried out only for a specific, unvarying frequency band by selecting the resonant frequency of the passive vibrational isolation system at an appropriate distance from the desired band. For example, a passive vibrational isolation system would have to be tuned to a very low resonant frequency of approximately <4 Hz, in order to isolate sufficiently in the band of the natural vibration of 16 Hz of the magnet. However, this would have the effect that the passive vibrational isolation system would be caused to vibrate by the placement of the patient in the magnetic resonance apparatus, for example.

These vibrations would likewise cause a disturbance of the magnetic field, in particular when iron is present in the surroundings.

It is not only the desired avoidance of vibrations generated by patients which would advocate a hard execution of a passive vibrational isolation system. A hard execution would also be advocated by the fact that the pulses in the hertz or subhertz bands generated by an expansion refrigeration machine for cooling superconducting magnets (what is termed a "cold head") are to be led into the bottom in order not to disturb the magnet. In the expansion refrigeration machine, the displacer piston forms an accelerated mass of approximately 1.5 kg which moves to and fro approximately 10 cm roughly every 0.5 seconds. The aim is also to suppress the vibrations caused by the gradient coil in accordance with the loudspeaker principle. The hard execution, required for this purpose, of a passive vibrational isolation system would, however, run counter to the requirement for adequate vibrational isolation in the resonant range of the magnet.

An actively controlled isolation module is present according to the invention for the purpose of resolving this conflict. Said module can be operated flexibly in the case of vibrations of different frequency.

The isolation system is preferably integrated in a foot present for the purpose of supporting the magnet on the surrounding structure, or designed such that it can be fitted on the foot. Owing to such integration or fitting, the production outlay for the isolation system is low and a particularly efficient vibrational isolation is achieved.

According to a very particularly preferred refinement, the isolation system comprises a passive isolation module which preferably has a vibration-damping material, in particular rubber, and/or a spring element.

The combination of an actively controlled isolation module with a passive isolation module is particularly advantageous for suppressing vibration in the case of a magnetic resonance apparatus, since in this case disturbing vibrations occur in a very wide frequency band which already begins below 1 Hz and reaches into the kilohertz band. Vibrations in the kilohertz band which lead to disturbing noise are also generated by the gradient coil.

The audible noise generated by the gradient coil should not be coupled into the surrounding structure or the building. For this purpose, the passive isolation module is preferably designed to damp acoustic vibrations, in particular vibrations with a frequency of more than 50 Hz.

The actively controlled isolation module is particularly preferably designed to damp non-acoustic vibrations, in particular vibrations with a frequency of less than 50 Hz.

It is also possible to optimize the passive isolation module and the actively controlled isolation module for vibrational isolation in different frequency bands. For example, the passive isolation system is optimized to the effect that vibrations of the magnet in the audible frequency bands are not coupled into the surrounding structure or the building. The actively controlled isolation module is, for example, optimized to the effect that the magnet is isolated against the vibrations of the surrounding structure or the building in the low frequency range.

In particular, the actively controlled isolation module is set up to damp vibrations in the region of a resonant frequency of the magnet. In order to realize this damping, the actively controlled vibrational system can be optimized with particular efficiency if a passive isolation module is simultaneously present. A particularly high damping can be achieved in the case of the resonant frequency of the magnet with the aid of the actively controlled isolation module so as to achieve a particularly high level of temporal stability of the constant magnetic field generated by the magnet.

According to another particularly preferred embodiment, the actively controlled isolation module is integrated as final controlling element in a control loop which has a sensor. It is thereby advantageously possible reliably to suppress disturbing vibrations with a variant frequency and amplitude.

The sensor is preferably designed as an acceleration pickup and/or as a detector for measuring mechanical strain and/or as a detector for measuring a mechanical deflection.

The sensor is fitted with particular advantage on the magnet or in its vicinity. This means that the actively controlled isolation module can be adjusted in a targeted manner to the disturbing vibrations impinging on the magnet.

The actively controlled isolation module and the possibly present passive isolation module are preferably arranged one above another like a stack, and/or integrated in the foot.

According to another preferred embodiment, a further passive isolation module, for example a spring element, is present which acts in parallel with the actively controlled isolation module and/or with the passive isolation module. It is thereby advantageously possible for a portion of a static load, for example resulting from the mass of the magnet, to be absorbed or borne.

The sensor is preferably fitted on the final controlling element or in its vicinity. Particularly in the case of the said stack-type arrangement of the two isolation modules, there is the advantage that the influence of the passive isolation module on the control loop can be detected directly.

The actively controlled isolation module functioning as final controlling element preferably has a piezoelectric actuator. It is thereby possible to operate the actively controlled isolation module over a wide frequency band reaching the kilohertz.

BRIEF DESCRIPTION OF THE DRAWING

An exemplary embodiment of a magnetic resonance apparatus according to the invention is explained in more detail below with the aid of FIGS. 1 and 2, in which.

DESCRIPTION OF THE PREFERRED EMBODIMENTS

Figure 1:
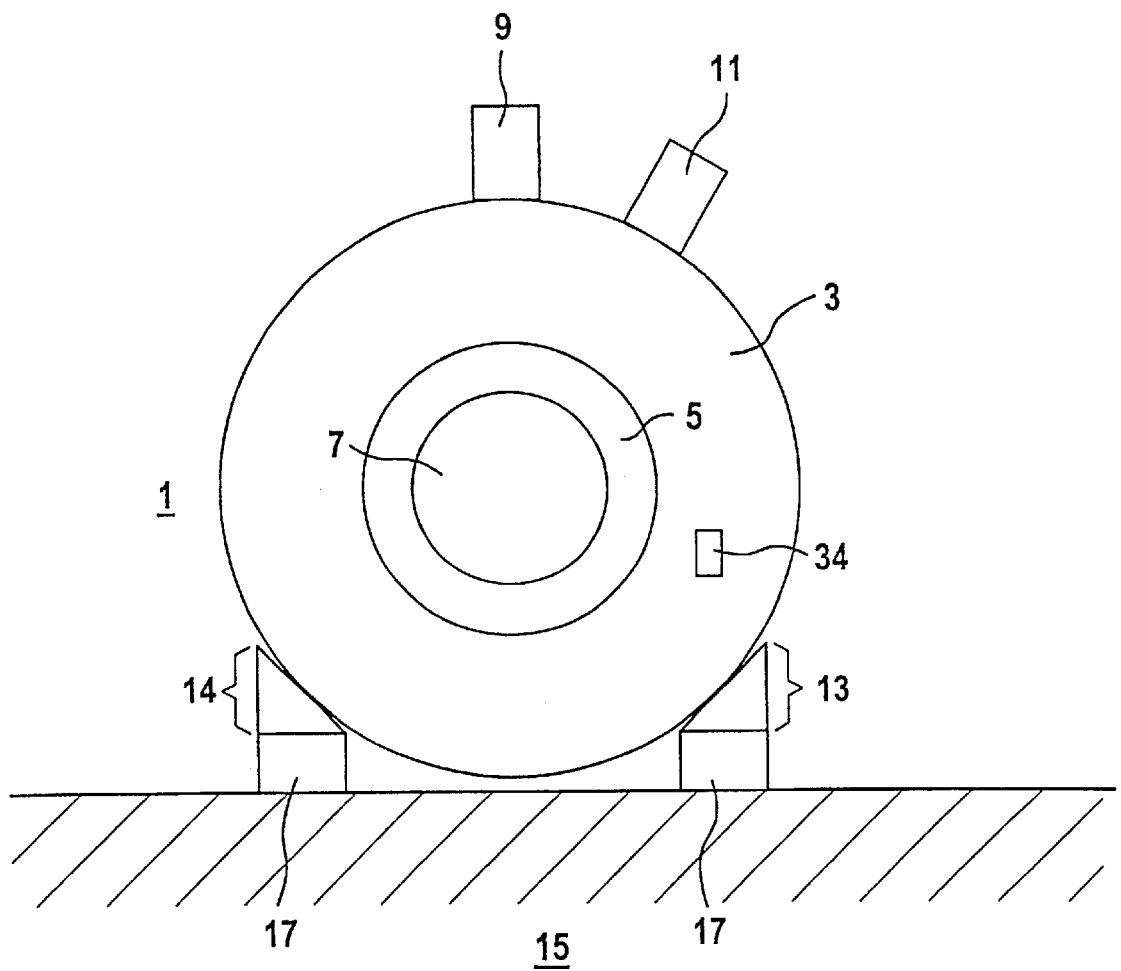
FIG. 1 shows a magnetic resonance apparatus according to the invention in a schematic overall illustration.

In a greatly simplified way, FIG. 1 shows a magnetic resonance apparatus 1 with a magnet 3 for generating a temporally and spatially constant magnetic field, and with a gradient coil 5 for generating a magnetic field of spatially varying strength. The magnet 3 and the gradient coil 5 enclose a patient space 7 in which an examination using nuclear magnetic resonance tomographs can be carried out.

The magnetic resonance apparatus 1 has an expansion refrigeration machine 9 ("cold head") for cooling the superconducting magnet 3. As an alternative or in addition thereto, a further expansion refrigeration machine 11 can be present which is aligned below 30° with reference to a vertical. In the expansion refrigeration machines 9, 11, a displacer piston moves to and fro—vertically or inclined with reference to a vertical—approximately 10 cm roughly every 0.5 seconds as an accelerated mass of approximately 1.5 kg. The recoil (impulse) produced in the process is transmitted to the magnet 3.

Very complex vibrations are caused by the gradient coil 5 in accordance with the loudspeaker principle. The frequencies of these vibrations vary depending on the examination method, and reach into the kilohertz band. Again, the directions of vibration are not limited to the vertical, but vibrations are also excited which are parallel to the building floor 15. Above all, in the case of the cylindrical magnet 3 illustrated these vibrations occur particularly strongly since the gradient coil 5 is thereby particularly heavy.

The magnetic resonance apparatus 1 is supported with the aid of feet 13, 14 on the building floor 15.

Figure 2:
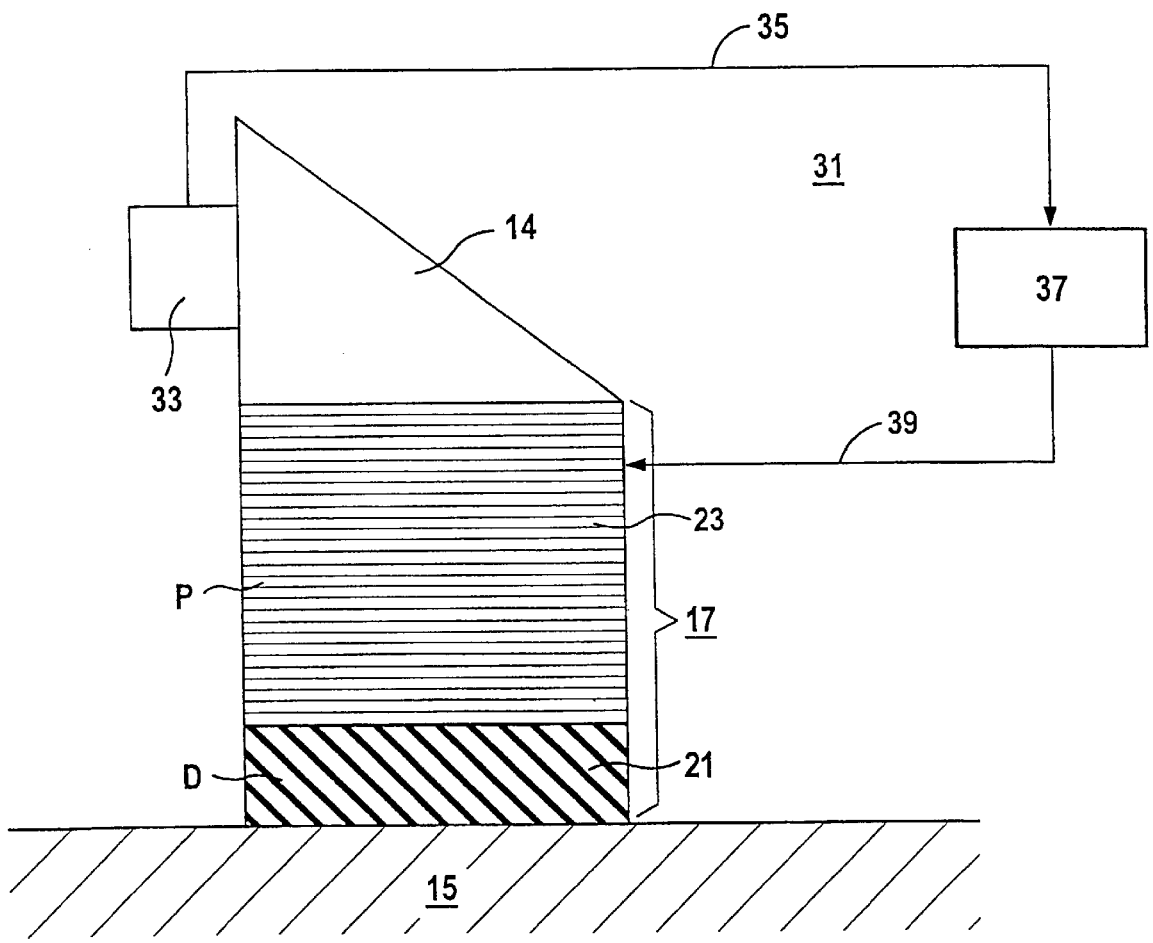
FIG. 2 shows a foot of the magnetic resonance apparatus of FIG. 1 in an enlarged representation.

Such a foot 14 is illustrated enlarged in FIG. 2. An isolation system 17 is inserted in a self-closed fashion with the foot 14 between the foot 14 and the building floor 15. The isolation system 17 is fastened on the foot 14.

The isolation system 17 for vibrational isolation of the magnet 3 from the building floor 15 has both an actively controlled isolation module 23 and a passive isolation module 21.

The passive isolation module 21 is fabricated from vibration-damping material D, in particular rubber, and tuned with its resonant frequency to approximately 15 Hz. The passive isolation module 21 ensures that vibrations of the magnet 3 or of the gradient coil 5 in the audible frequency band are not coupled into the building. The passive isolation module 21 can also be designed as a spring bearing or as a rubber mat with a spring excursion of approximately 2 mm. The hardness of the rubber and thus its resonant frequency are selected in such a way that the impulse of the expansion refrigeration machine 9, 11 causes no artifacts.

The actively controlled isolation module 23 for damping vibrations in the frequency band between 1 and 40 Hz is designed for the purpose of isolating the magnet 3 against vibrations of the building. The actively controlled isolation module 23 is integrated as final controlling element in a control loop 31 which is a constituent of the isolation system 17. The actively controlled isolation module 23 is designed as a piezoelectric actuator with a piezoelectric crystal P.

The control loop 31 also has a sensor 33 which is designed as an acceleration pickup and is fastened on the foot 14. Alternatively or in addition, the sensor 33 or another sensor 34 could also be arranged on the magnet 3 (see FIG. 1) or on the piezoelectric actuator of the actively controlled isolation module 23. In the last-named case, it is also advantageous if the sensor 33 is designed for measuring the mechanical strain at the actuator, and is fastened on the actuator. The sensor 33 can then be a strain gauge, for example.

The result of changing the length of the final controlling element in phase is that the sensor 33, and thus also the foot 14 with the isolation system 17, are at rest during the magnetic resonance imaging.

The measurement of the mechanical strain directly at the actuator has the advantage, furthermore, that the influence of the vibration-damping material D on the control loop 31 can be detected directly.

In the exemplary embodiment illustrated, the sensor 33 is an accelerometer and is designed as a piezocrystal with a weight bonded on.

The sensor 33 is connected via a measuring line 35 to an evaluation and control device 37 which is, for its part, connected via a control line 39 to an actively controlled isolation module 23 such that a closed control loop is formed.

The actively controlled isolation module 23 and the control loop 31 are set up, in particular, to damp vibrations in the region of a resonant frequency of the magnet 3. In accordance with another example, the resonant frequency can be approximately 16 Hz for a C-shaped magnet. A both flexible and strong and reliable vibrational isolation of the magnet 3, in particular against vibrations of the building, is ensured by the alignment of the actively controlled isolation module 23 and of the control loop 31 being optimized with reference thereto. On the other hand, the passive isolation module 21 ensures that audible noise is not coupled into the building.

The effect of the combination of the active isolation module 23 and the passive isolation module 21 is, moreover, that the magnetic resonance apparatus 1 would not be excited to vibrate by the placement of a patient in the patient space 7, resulting in destruction of the magnet 3. It is, moreover, ensured that the impulse generated by the expansion refrigeration machine 9, 11 is reliably led into the floor. Moreover, it is possible for the isolation system 17 to be designed sufficiently hard in such a way that the vibrations generated by the gradient coil 5 are damped while a disturbance of the magnet 3 is avoided.

Overall, three types of vibration can be controlled by the magnetic resonance apparatus according to the invention:

a) vibrations from the building
b) audible noise from the apparatus
c) low-frequency vibrations in the apparatus.

What is claimed is:

1. A magnetic resonance apparatus, comprising:
   a gradient coil for generating a magnetic field of spatially varying strength;
   a superconducting magnet for generating a temporally and spatially constant magnetic field surrounding the gradient coil, the magnet and the gradient coil defining a patient space in which an examination using nuclear magnetic resonance tomographs can be carried out; and
   a vibrational isolation system supporting the magnet on a building floor,
   wherein the vibrational isolation system includes an actively controlled isolation module mounted on an upper surface of a passive isolation module.

2. The magnetic resonance apparatus of claim 1, wherein,
   the passive isolation module comprises a vibration-damping material tuned to a resonant frequency decoupling vibrations of the magnet and of the gradient coil in an audible frequency band from the building floor.

3. The magnetic resonance apparatus of claim 2, further comprising:
   a refrigeration machine connected to the magnet, and wherein,
   the passive isolation module further comprises a spring bearing with a spring excursion of approximately 2 mm,
   a resonant frequency of the spring bearing suppressing artifacts from an impulse of the refrigeration machine.

4. The magnetic resonance apparatus of claim 2, wherein,
   the actively controlled isolation module is tuned to a resonant frequency band between 1 and 40 Hz for decoupling vibrations of the building from the magnet,
   the actively controlled isolation module comprising a closed control loop feeding a piezoelectric actuator with a piezoelectric crystal.

5. The magnetic resonance apparatus of claim 4, wherein,
   the control loop includes an acceleration pickup sensor mounted on a foot supporting the magnet on the floor.

6. A vibration isolation system for a magnetic resonance apparatus, comprising:
   an actively controlled isolation module; and
   a passive isolation module mounted beneath the actively controlled module,
   the passive isolation module configured for connection to a building floor and comprising a vibration-damping material tuned with a resonant frequency decoupling vibrations of a magnet and of a gradient coil of the magnetic resonance apparatus in an audible frequency band from the building floor,
   the actively controlled isolation module being connected to a foot for mounting to and supporting the magnet,
   the actively controlled isolation module tuned to a resonant frequency band decoupling vibrations of the building from the magnet,
   the actively controlled isolation module comprising a closed control loop feeding a piezoelectric actuator,
   the control loop including an acceleration pickup sensor mounted on the foot.

* * * * *